United States Patent
Choi et al.

(10) Patent No.: US 10,910,270 B2
(45) Date of Patent: Feb. 2, 2021

(54) METHOD OF FORMING AND PACKAGING SEMICONDUCTOR DIE

(71) Applicant: MagnaChip Semiconductor, Ltd., Cheongju-si (KR)

(72) Inventors: Jae Sik Choi, Cheongju-si (KR); Jin Won Jeong, Seoul (KR); Byeung Soo Song, Sejong-si (KR); Dong Ki Shim, Gumi-si (KR); Jin Han Bae, Gumi-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/526,020

(22) Filed: Jul. 30, 2019

(65) Prior Publication Data

US 2020/0312715 A1    Oct. 1, 2020

(30) Foreign Application Priority Data

Mar. 28, 2019    (KR) .................. 10-2019-0036315

(51) Int. Cl.
*H01L 21/78* (2006.01)
*H01L 23/00* (2006.01)
(Continued)

(52) U.S. Cl.
CPC .......... *H01L 21/78* (2013.01); *H01L 21/3043* (2013.01); *H01L 21/76801* (2013.01);
(Continued)

(58) Field of Classification Search
CPC .............. H01L 21/78; H01L 21/3043; H01L 21/76838; H01L 24/03; H01L 24/11; H01L 21/76801; H01L 2224/03009
(Continued)

(56) References Cited

U.S. PATENT DOCUMENTS 9,209,084 B2    12/2015    Lei et al.
9,728,518 B2 *   8/2017    Topacio .................. H01L 21/78
(Continued)

FOREIGN PATENT DOCUMENTS

JP          2016-539497 A    12/2016
KR      10-2018-0023572 A     3/2018

OTHER PUBLICATIONS

Korean Office Action dated Jul. 31, 2020 in corresponding Korean Patent Application No. 10-2019-0036315 (8 pages in Korean).

*Primary Examiner* — Vu A Vu
(74) *Attorney, Agent, or Firm* — NSIP Law

(57) ABSTRACT

A manufacturing and packaging method for a semiconductor die is provided. The method prepares a wafer which has a seal-ring region, forms a first interlayer insulating film on the wafer, forms a metal wiring in the first interlayer insulating film, forms a second interlayer insulating film on the first interlayer insulating film, forms metal pads on the second interlayer insulating film, forms a passivation layer on the metal pads, removes a portion of the passivation layer in a region adjacent to the seal-ring region to expose the second interlayer insulating film, etches a portion of the second interlayer insulating film, forms a bump on the metal pads, removes the first interlayer insulating film and the second interlayer insulating film in the region adjacent to the seal-ring region by a laser grooving process, and dices the wafer into a first semiconductor die and a second semiconductor die.

12 Claims, 14 Drawing Sheets

(51) Int. Cl.
*H01L 21/304* (2006.01)
*H01L 21/768* (2006.01)

(52) U.S. Cl.
CPC ........ *H01L 21/76838* (2013.01); *H01L 24/03* (2013.01); *H01L 24/11* (2013.01); *H01L 2224/03009* (2013.01)

(58) Field of Classification Search
USPC .......................................................... 438/462
See application file for complete search history.

(56) References Cited

U.S. PATENT DOCUMENTS

| | | |
|---|---|---|
| 10,068,929 B2 | 9/2018 | Min et al. |
| 2010/0181650 A1 | 7/2010 | Shigihara et al. |
| 2016/0126324 A1* | 5/2016 | Yu .......................... H01L 29/402 |
| | | 257/503 |
| 2017/0256638 A1 | 9/2017 | Macekwee et al. |
| 2017/0294471 A1* | 10/2017 | Su ..................... H01L 27/14687 |
| 2019/0035750 A1 | 1/2019 | Han et al. |

\* cited by examiner

METHOD OF FORMING AND PACKAGING SEMICONDUCTOR DIE

CROSS-REFERENCE TO RELATED APPLICATION

This application claims the benefit under 35 U.S.C. 119(a) of Korean Patent Application No. 10-2019-0036315 filed on Mar. 28, 2019 in the Korean Intellectual Property Office, the entire disclosure of which is incorporated herein by reference for all purposes.

BACKGROUND

1. Field

The following description relates to method of forming and packaging semiconductor die.

2. Description of Related Art

In view of the high resolution of display devices, a display Integrated Circuit (IC) may need to be implemented with a fine pattern. In order to implement such a fine pattern, a short should be prevented between the patterns. That is, as the pitch between the wirings decreases with the miniaturization of the display IC, problems related to insulation become an important issue.

For insulation between wirings, an insulating film may be formed of an insulating material having a low dielectric constant. The dielectric constant of an insulating film may be lowered by increasing the pore (e.g. air layer) in the insulating material.

However, when the dielectric constant is lowered, various problems arise when cutting the wafer with a blade dicing process. For example, the bonding force decreases due to the lowered dielectric constant, brittleness increases, and the strength of the wafer decreases.

In addition, stress is concentrated on an insulating film having a low dielectric constant due to a mechanical cutting process using a cutting blade, and the interface may be delaminated due to a decrease in bonding force between the insulating film and the silicon interface.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a manufacturing and packaging method of a semiconductor die includes preparing a wafer which has a seal-ring region, forming a first interlayer insulating film on the wafer, forming a metal wiring in the first interlayer insulating film, forming a second interlayer insulating film on the first interlayer insulating film, forming metal pads on the second interlayer insulating film, forming a passivation layer on the metal pads, removing a portion of the passivation layer in a region adjacent to the seal-ring region to expose the second interlayer insulating film, etching a portion of the second interlayer insulating film, forming a bump on the metal pads, removing the first interlayer insulating film and the second interlayer insulating film in the region adjacent to the seal-ring region by a laser grooving process, and dicing the wafer into a first semiconductor die and a second semiconductor die.

The method may include preparing a flexible film which has input wire patterns and output wire patterns, and attaching the bump to at least one of the input wire patterns and the output wire patterns with conductive balls.

The method may further include generating a silicon debris from the laser grooving process, wherein the silicon debris is formed starting from a top surface of the second interlayer insulating film.

A height of the silicon debris may be lowered by a thickness of the passivation layer.

The laser grooving process may include a first laser grooving process and a second laser grooving process, and a pulse width of the second laser grooving process may be greater than a pulse width of the first laser grooving process.

A dielectric constant of the first interlayer insulating film may be below 3.0, and the dielectric constant of the first interlayer insulating film may be lower than a dielectric constant of the second interlayer insulating film.

In a general aspect, a manufacturing and packaging method of a semiconductor die includes preparing a wafer which has a scribe line and a seal-ring-region, forming an interlayer insulating film, a metal wiring, and metal pads on the wafer, forming a passivation layer on the metal pads and the interlayer insulating film, etching the passivation layer, exposing a portion of the metal pads, etching the interlayer insulating film, forming a bump on the metal pads, performing a laser grooving process to generate a silicon debris on the etched interlayer insulating film adjacent to the sealing-region, removing the interlayer insulating film in the scribe line by the laser grooving process; and dicing the wafer to form the semiconductor die.

The interlayer insulating film comprises a first interlayer insulating film and a second interlayer insulating film, a dielectric constant value of the first interlayer insulating film is less than a dielectric constant value of the second interlayer insulating film, the metal wiring comprises a copper component, the metal pad comprises an aluminum component, and the passivation layer comprises a silicon nitride film.

A portion of the passivation layer may be removed in a region adjacent to the seal-ring region, and a portion of the passivation layer may be maintained in a region adjacent to the bump.

A bottom of the silicon debris may be lowered by a thickness of the passivation layer.

In a general aspect, a manufacturing and packaging method of a semiconductor die includes forming a first interlayer insulating film on a substrate, forming a second interlayer insulating film on the first interlayer insulating film, forming metal pads on the second interlayer insulating film, forming a passivation layer on the metal pads, removing a portion of the passivation layer to expose the second interlayer insulating film, forming a bump on the metal pads, over-etching a portion of the second interlayer insulating film and a portion of the first interlayer insulating film by a laser grooving process; and generating a silicon debris from the laser grooving process, wherein the silicon debris is formed on an upper surface of the over-etched portion of the second interlayer insulating film, and wherein a bottom surface of the silicon debris is positioned lower than a bottom surface of the passivation layer, and a top surface of the silicon debris is lower than a top surface of the bump.

A bottom surface of the silicon debris may be positioned lower than a bottom surface of the bump.

Other features and aspects will be apparent from the following detailed description, the drawings, and the claims.

Figure 1:
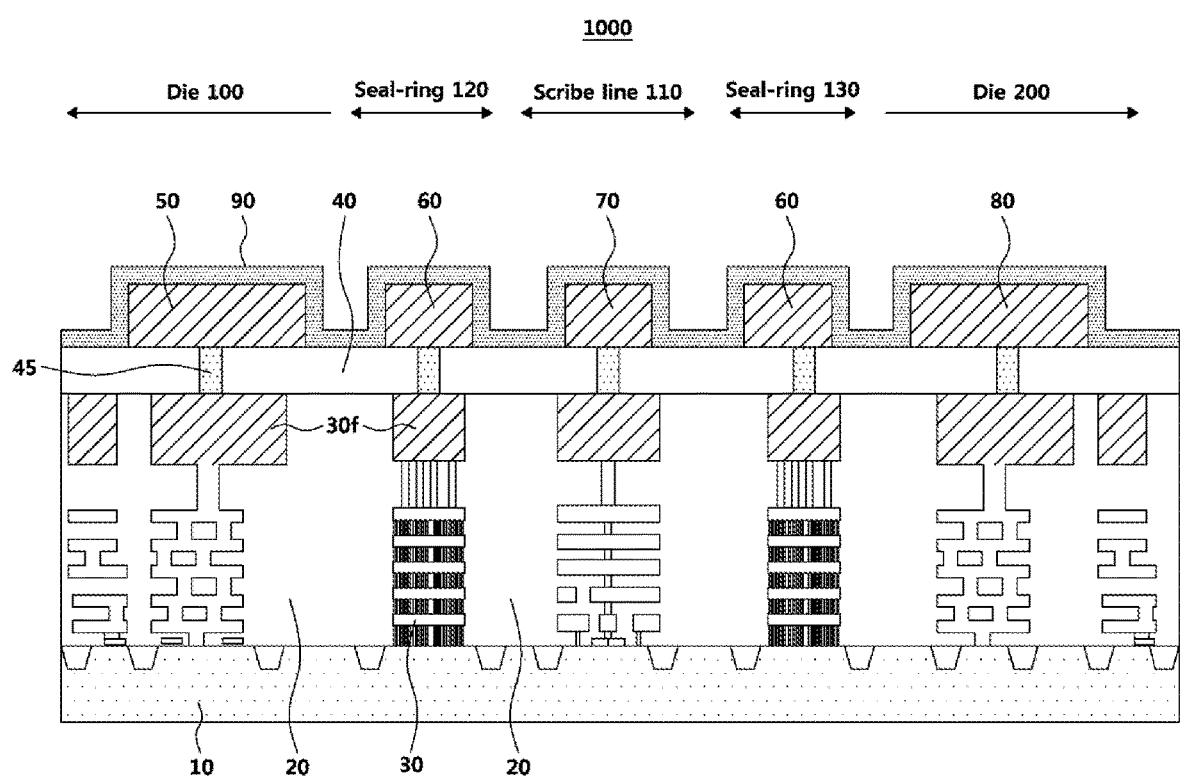
FIG. 1 is a cross-sectional view of an example of a wafer in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

The following description is provided to solve short-circuit failure caused by anisotropic conductive film (ACF) conductive balls during an ACF bonding process which is a subsequent process, due to the silicon debris formed in the passivation layer during the laser grooving process for the semiconductor die. Hereinafter, the features of the present disclosure will be described in detail with reference to the examples shown in the drawings.

The following description provides a method of forming and packaging a semiconductor die that may eliminate the reason for short-circuit failure by performing a grooving process using a laser, up to a lower region of an insulating film on a scribe line of a wafer during a sawing process for cutting a unit cell in which a display IC is mounted, and by minimizing the height of generation of silicon debris which obstructs the flow of ACF conductive balls at the time of ACF bonding during a panel process of a semiconductor die.

That is, the following description modifies the position where the silicon debris is formed during a laser grooving process, thereby ensuring a sufficient space between the top of the bump and the silicon debris.

FIG. 1 is a cross-sectional view of an example of a wafer according to an example of the present disclosure.

Referring to FIG. 1, the wafer 1000 includes a first semiconductor die 100, a second semiconductor die 200 and a scribe line 110, and a seal-ring region 120, 130 located between each of the first semiconductor dies 100, 200 and the scribe line 110. The seal-ring region 120, 130 may prevent cracking when dicing the wafer 1000 divided into the first and second semiconductor dies 100, 200.

The semiconductor die may have several blocks for signal processing. A gate insulating film 20, a gate electrode, a contact plug, a metal wiring 30, vias 45, metal pads 50, 60 80, and the like may be formed for the signal processing. For convenience, the wafer is divided into first semiconductor die 100 and the second semiconductor die 200. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

The scribe line 110 may be a region where a test pattern is formed to test the performance of the first and second semiconductor dies 100, 200. Alternatively, the scribe line 110 may be a region where the thickness of the residual film is measured after the etching process, a pattern that measures the pattern length or the like is formed, or a pattern for the mask alignment is formed. The scribe line 110 may be removed by a sawing process (or dicing) subsequently.

In an example, each of the semiconductor dies 100, 200 forms a low dielectric insulating film 20 (or a first interlayer insulating film) on a semiconductor substrate 10. The low dielectric insulating film 20 may reduce RC delay. In an example, compounds such as SiOC, SiC, SiO2 or similar compounds of which the dielectric constant of the low dielectric layer 20 is 3 or less may be used. A plurality of metal wiring lines 30 (multi-layer metal:MLM) may be formed on the low dielectric insulating film 20. Copper (Cu) metal or aluminum metal may be used for the metal wiring 30. Copper metal may be widely used because it has a lower resistivity than aluminum metal. The last metal wiring 30*f* of the metal wiring may be formed to be thicker than other metal wirings 30 in order to reduce the resistance.

In an example, the second interlayer insulating film 40 is deposited on the last metal wiring 30*f* and the low dielectric insulating film 20 in the semiconductor dies 100, 200. The low dielectric insulating film 20, which is the first interlayer insulating film, and the second interlayer insulating film 40 may be collectively referred to as interlayer insulating film. A metal via 45 is formed in the second interlayer insulating film 40 to connect the metal pads 50, 60, and 80 to the last metal wiring 30*f*.

In other words, the interlayer insulating film of each of the semiconductor dies 100, 200 in the general aspect includes the first and second interlayer insulating films 20 and 40. The second interlayer insulating film 40 prevents moisture and alleviates impact when wire bonding is performed on the metal pads. The dielectric constant value of the second interlayer insulating film 40 may be greater than the dielectric constant of the low dielectric insulating film 20. Alternatively, in order to reduce RC delay, the same insulating film as the low dielectric insulating film 20 may be used as the second interlayer insulating film 40. A thick silicon oxide film, a silicon nitride film, or a silicon oxynitride film may be used as the second interlayer insulating film 40.

Metal pads 50, 60, and 80 and a test pad 70 are respectively formed in the semiconductor die 100, 200 and the scribe line 110. Aluminum (Al) metal may be used for the metal pads 50, 60, and 80. A passivation layer 90 may be formed on the low dielectric insulating film 20, the second interlayer insulating film 40, the metal pads 50, 60, and 80, and the test pad 70. The passivation layer 90 may protect the device from external moisture. The passivation layer 90 may be formed by being successively deposited using a silicon oxide film and a silicon nitride film. That is, the passivation layer 90 may be a double-layered film of a silicon oxide film and a silicon nitride film.

Alternatively, only a silicon nitride film may be used as a single layer. The passivation layer 90 may be formed in direct contact with the second interlayer insulating film 40. The passivation layer 90 may be formed to surround the metal pads 50, 60, and 80 and the test pad 70.

Figure 2A:
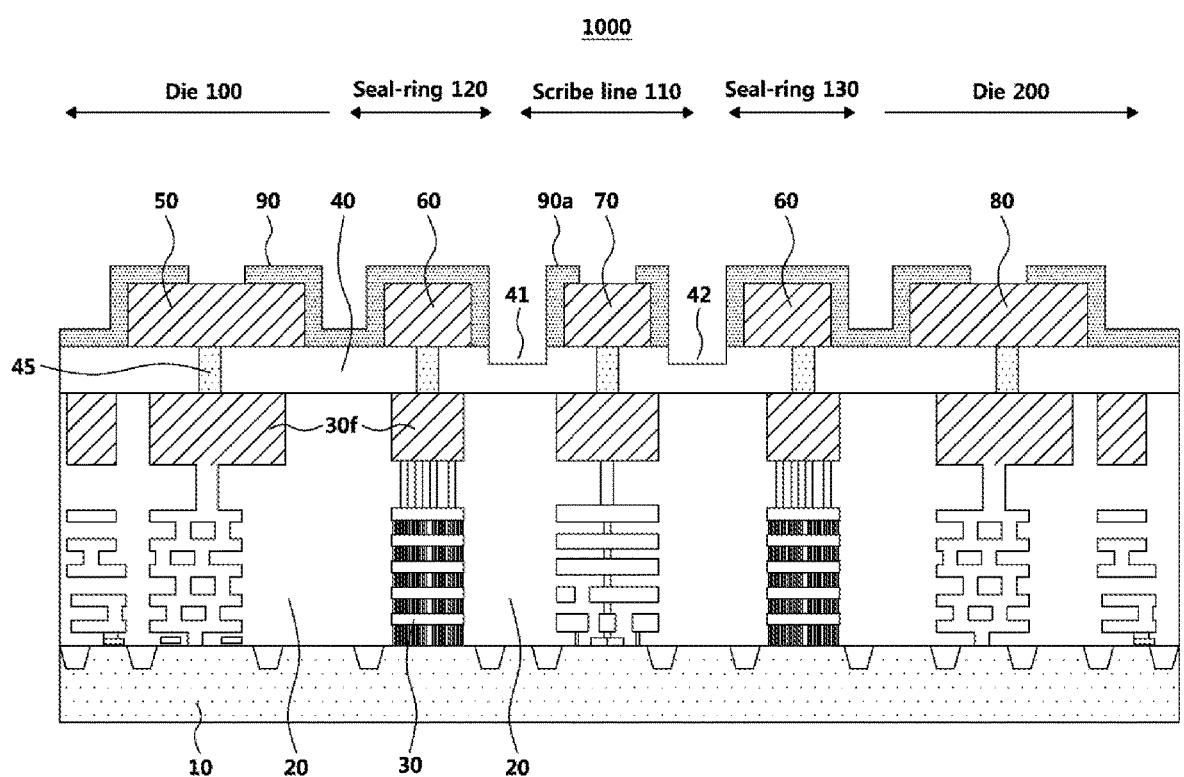
FIGS. 2A and 2B illustrate cross-sectional views of examples of a wafer after patterning a passivation layer in accordance with one or more embodiments.
Figure 2B:
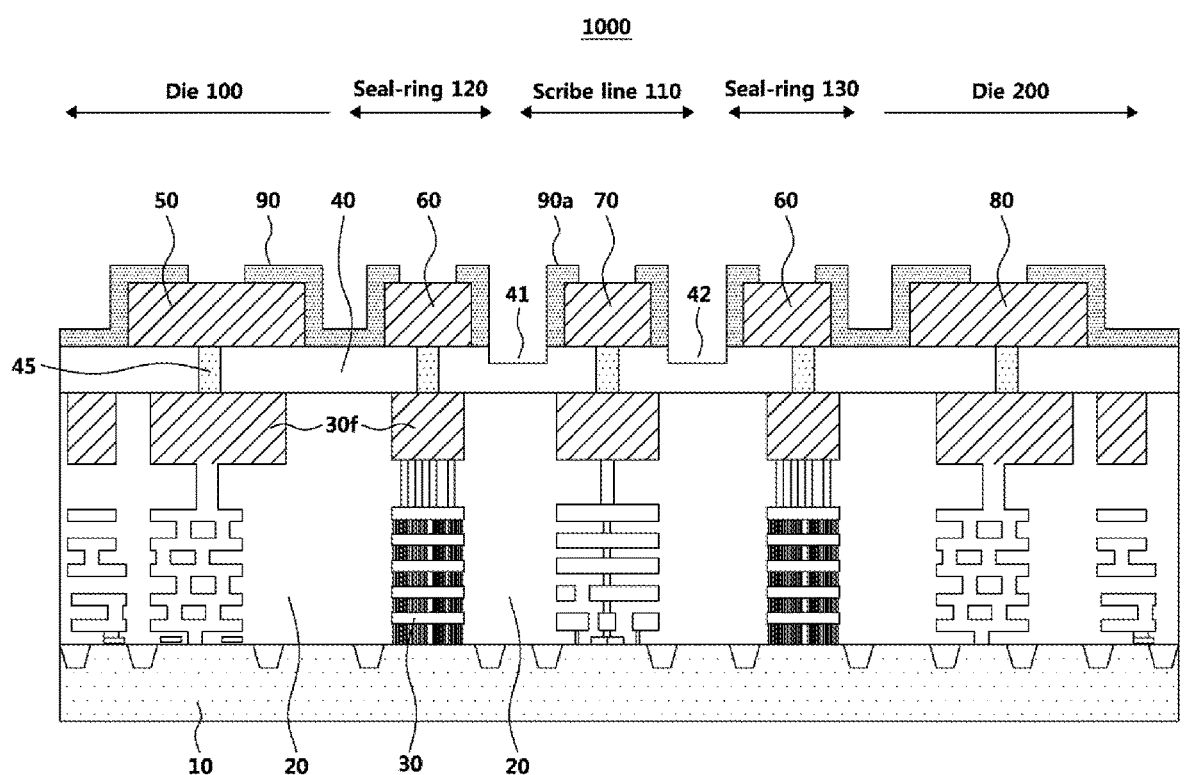

FIGS. 2A and 2B are cross-sectional views of an example of a wafer after the patterning of a passivation layer 90.

Referring to FIGS. 2A and 2B, the wafer 1000 according to an example may expose at least portions of the second interlayer insulating film 40, the metal pads 50, 60, and 80 and the test pad 70 after patterning the passivation layer 90 with a passivation etch mask. Portions 41 and 42 of the second interlayer insulating film 40 may be partially removed after patterning the passivation layer 90 between the metal pads 50, 60 and 80 and the test pad 70.

In the first and second semiconductor dies 100, 200 according to the example, the dies may be formed on the opposite sides of the scribe line 110 where the test pad 70 is located, the passivation layer 90 remains as originally formed only in the die, and a part of the passivation layer 90*a* remains on the test pad 70 in the scribe line 110. The passivation layer 90*a* may remain partially formed on the test pad 70 in order to protect the surface of the test pad 70 from the subsequent etching process.

With regard to removing the passivation layer according to the example, the passivation etch mask of the present application may be slightly modified from the typical passivation etch mask. Accordingly, the existing manufacturing method for semiconductor die may be applicable.

Figure 3:
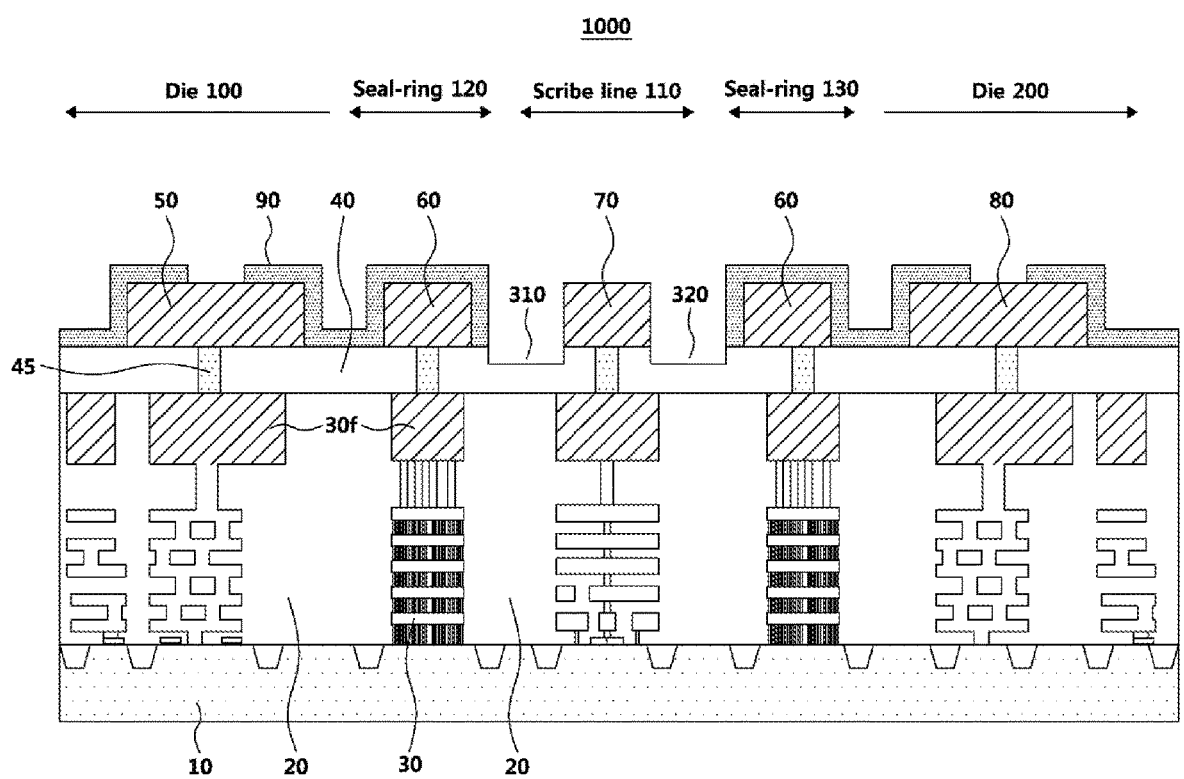
FIG. 3 is a cross-sectional view of an example of a wafer after patterning a passivation layer in accordance with one or more embodiments.

FIG. 3 is a cross-sectional view of an example of a wafer after the patterning of the passivation layer 90.

Referring to FIG. 3, in the wafer 1000 according to the example, the passivation layer 90 on the test pad 70 may be totally removed. Accordingly, there is no passivation layer 90 in the region between the first semiconductor die 100 and the second semiconductor die 200. Therefore, the process is further simplified.

The second interlayer insulating film 40 may be further etched in areas 310 and 320 of the second interlayer insulating film 40 when the passivation layer 90 in the scribe line 110 is removed. The etched areas 310 and 320 may be wider than the etched areas 41 and 42 in FIG. 2.

Figure 4:
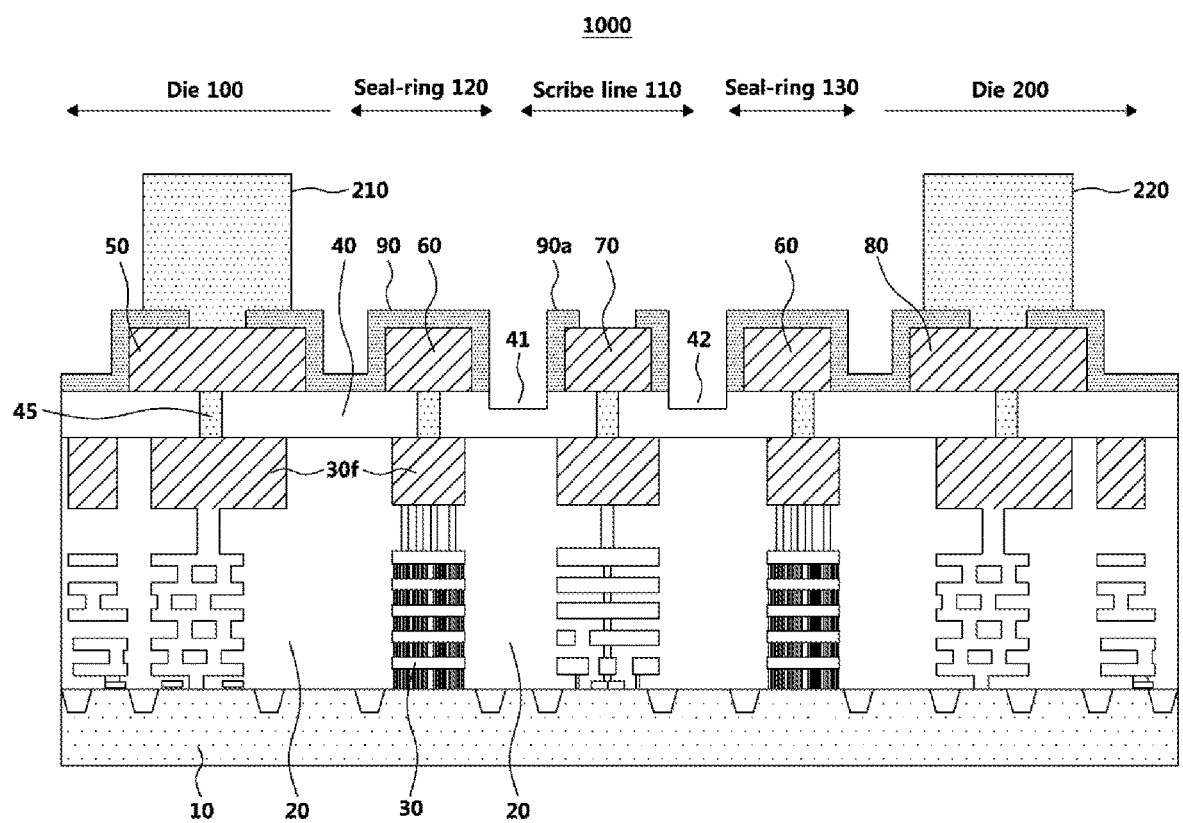
FIG. 4 is a cross-sectional view of an example of a wafer after a bump is formed in accordance with one or more embodiments.

FIG. 4 is a cross-sectional view of an example of a wafer after bumps are formed.

As illustrated in FIG. 4, first and second metal bumps 210 and 220 may be respectively formed on the semiconductor dies 100, 200 using a gold material or a similar material according to the example. The first and second metal bumps 210 and 220 that are disposed over the semiconductor dies 100, 200 according to the example may be subsequently connected to each other with Cu lead wires formed on the polyimide during the COF packaging process. The metal bumps 210 and 220 may be formed such that they are directly connected to the metal pads 50 and 80. Although not shown in FIG. 4, in an example, a metal bump may also be formed such that it is directly connected to the metal pad 60. Since the passivation layer 90 is removed on the metal pads 50 and 80, connection is possible.

Figure 5:
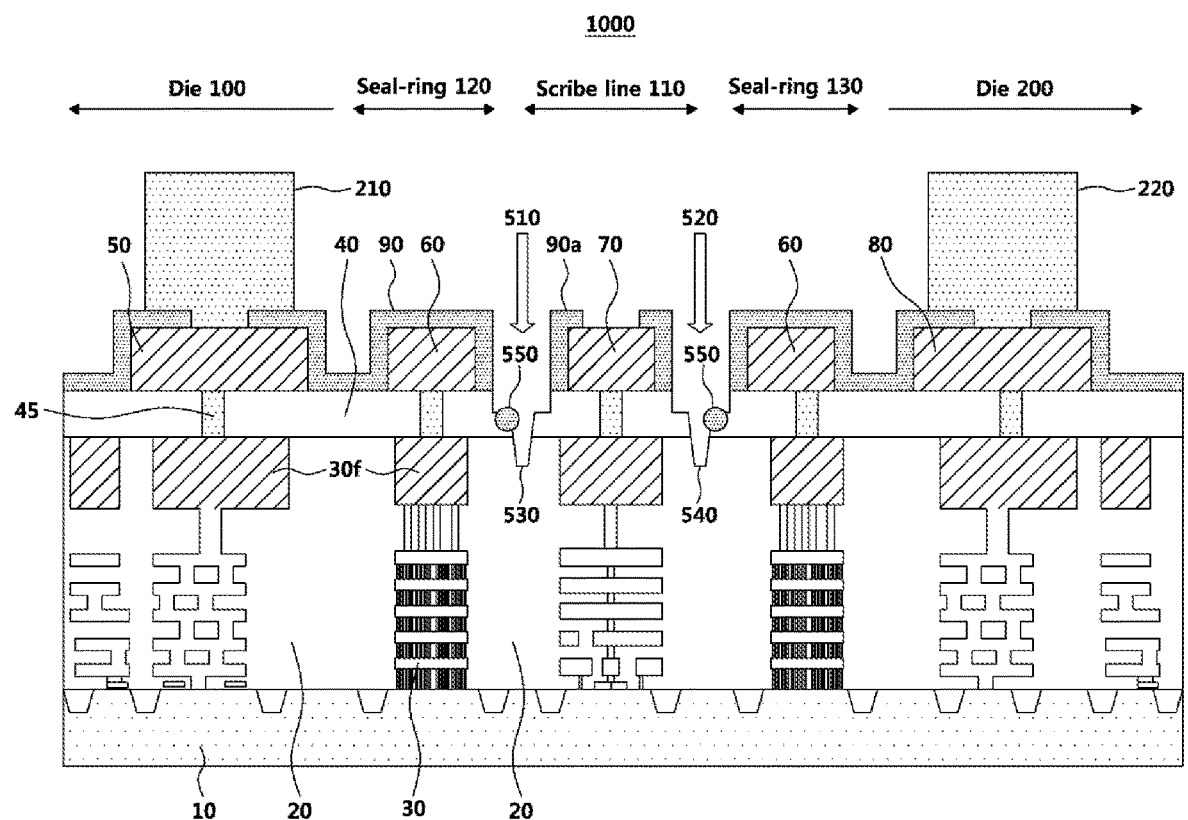
FIG. 5 is a cross-sectional view of an example of a wafer after a first laser grooving in accordance with one or more embodiments.

FIG. 5 is a cross-sectional view of an example of a wafer after a first laser grooving process.

A first laser grooving process, which uses a plurality of laser light sources 510 and 520, may be implemented on the wafer 1000 according to the example. Trenches may be formed by the first laser grooving process. The first laser grooving process may be implemented with respect to the partially etched second interlayer insulating films 41 and 42 (FIG. 4). The second interlayer insulating film 40 may be completely removed by this process in the area where the laser grooving process is being implemented. Further, a part of the low dielectric insulating film 20 may be removed.

Thus, the second interlayer insulating film 40 and the low dielectric insulating film 20 may be partially removed to form the first and second grooves 530 and 540 which have a specific depth. The second interlayer insulating film 40 and the low dielectric insulating film 20 may be irradiated by laser and dissolved by the heat generated by the laser.

The first laser grooving process according to the example may use a plurality of laser light sources 510 and 520 having a narrow pulse width so that a plurality of grooves 530 and 540 having a small width may be formed simultaneously.

The second interlayer insulating film 40 in the wafer 1000 according to the example may be easily removed by laser light. Additionally, the low dielectric insulating film 20, which may include carbon atoms such as SiOC, may be removed by laser light more easily. The laser pulse is irradiated focusing on the wafer surface. The laser pulse may be continuously absorbed into the low dielectric insulating film, and may instantaneously vaporize the low dielectric insulating film after absorbing a certain level of heat energy.

Two shallow grooves 530 and 540 may be formed in the scribe line 110. The reason for forming the two grooves is to effectively isolate the first semiconductor die 100 from the second semiconductor die 200.

Another reason is because a first grooving using a laser light source having a smaller pulse width may reduce impact or cracks to silicon semiconductor dies 100, 200 as compared with using a laser light source having a large pulse width. Performing a first laser grooving process using a laser light source having very high energy may easily damage the semiconductor dies 100, 200. Accordingly, it is preferable to use a first grooving process using laser light source having a smaller pulse width with a low energy.

In an example, at this stage, small silicon debris 550 may be formed in the semiconductor dies 100, 200. As mentioned above, a derivative (a kind of silicon debris) combined with a silicon element and a metal component such as copper or aluminum may be generated.

Figure 6:
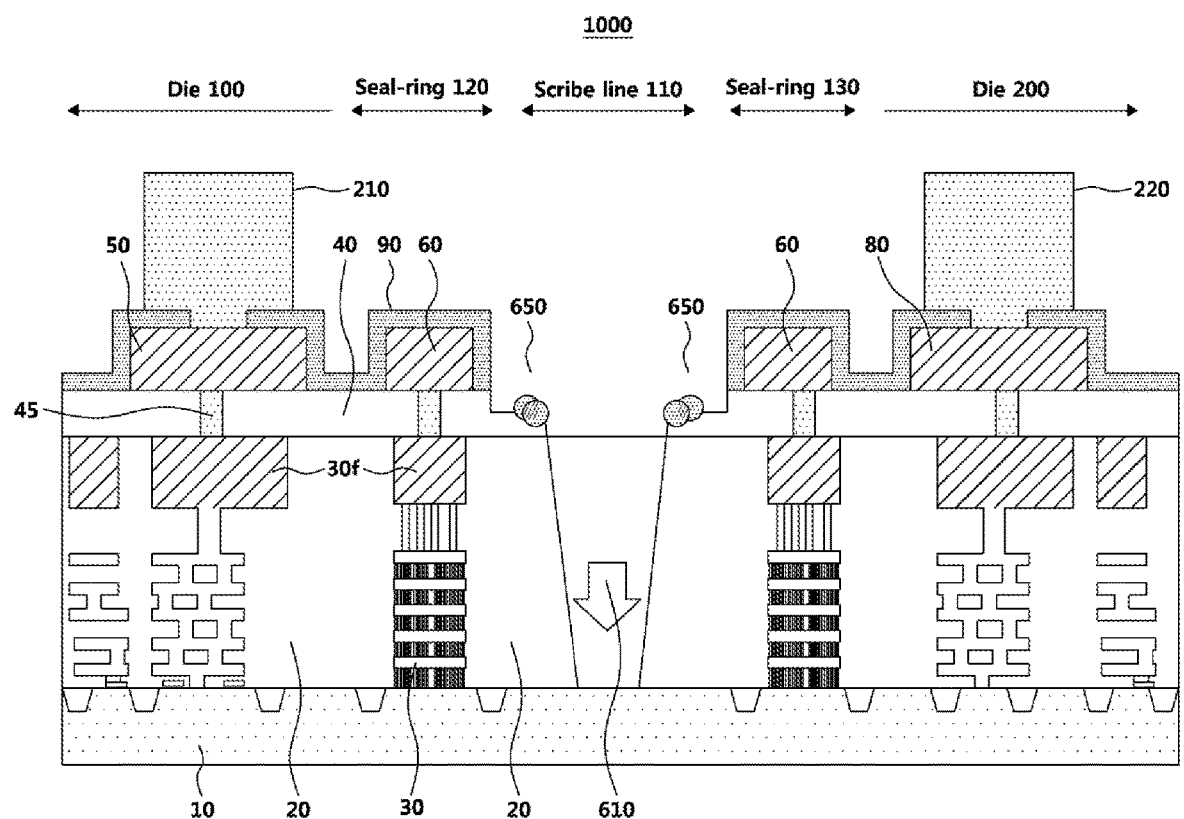
FIG. 6 is a cross-sectional view of an example of a wafer after a second laser grooving in accordance with one or more embodiments.

FIG. 6 is a cross-sectional view of an example of a wafer after a second laser grooving process.

Referring to FIG. 6, the wafer 1000 according to the example may perform a second laser grooving process using a second laser light source 610. The low dielectric insulating film 20 formed on the substrate 10 may be removed by the second laser grooving process. The silicon substrate 10 may be exposed.

The second laser grooving process is a grooving process that is implemented using a laser between the two grooves 530 and 540 (FIG. 5) formed by the first laser grooving process. Since the grooves may be already initially formed by the first laser grooving process, additional grooves may be easily made to some extent. A light source having a width greater than the pulse width used for the first laser grooving process may be used, because both the first groove 530 and the second groove 540 should be removed.

At this stage, silicon debris 650 may be formed to be greater by the laser grooving process in the wafer 1000 according to the example. The test pattern of the wafer 1000 according to the example includes copper metal, aluminum metal, and similar metals in the low dielectric insulating film 20. As these materials are dissolved, the silicon debris 650 may be formed by combining with the silicon material in the low dielectric insulating film 20.

If the silicon debris contains metal components, such as Si—Cu, Si—Al or Si—Cu—Al, silicon debris may have conductivity. That is, the silicon debris 650 may include metal components such as copper or aluminum. Thus, the silicon debris 650 may be formed on the side surface of the second interlayer insulating film 40, and on the side surface of the low dielectric insulating film 20 which are etched by laser grooving, and may be formed to extend to the upper surface of the second interlayer insulating film 40. The laser grooving process helps that the brittle region of the low dielectric constant insulation film 20 may be easily removed.

Figure 7:
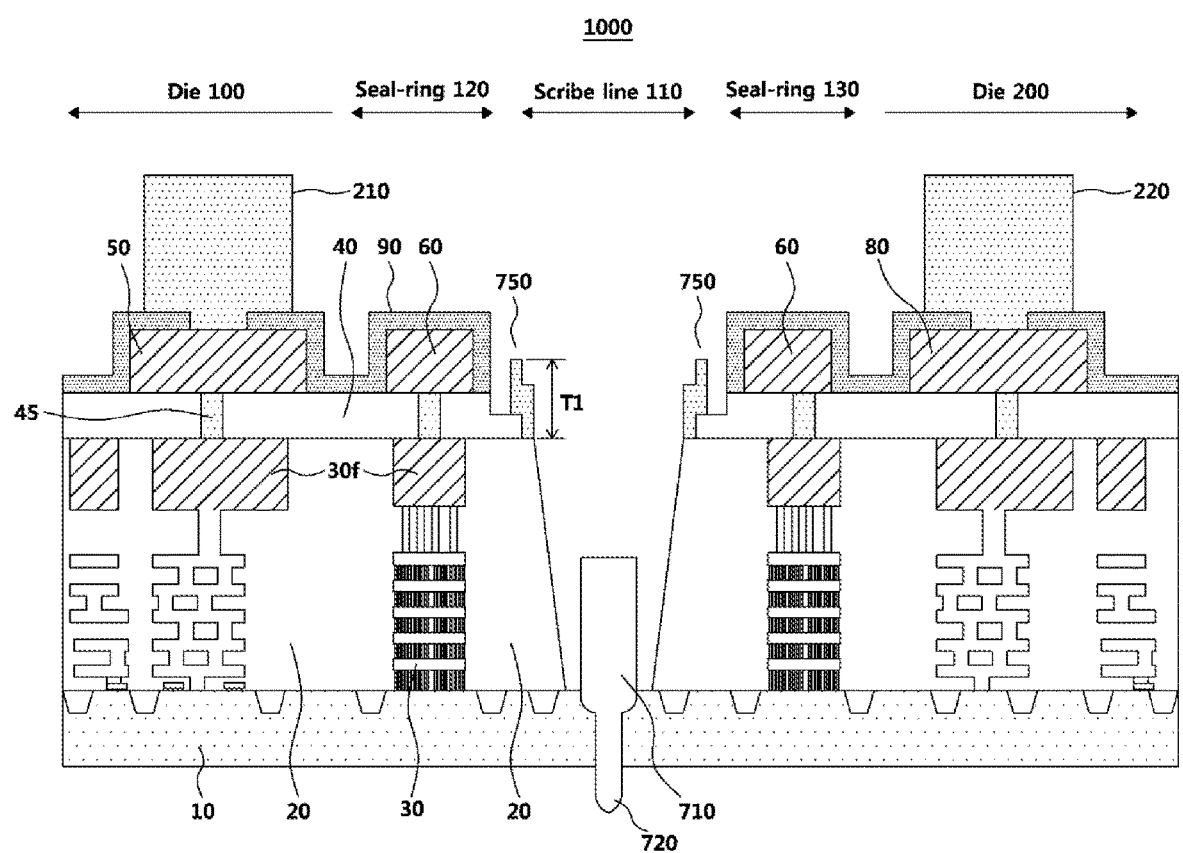
FIG. 7 is a cross-sectional view of an example of a wafer after grooving in accordance with one or more embodiments.

FIG. 7 is a cross-sectional view of an example of a wafer after a laser grooving process.

Referring to FIG. 7, the silicon substrate 10 in the wafer 1000 may be exposed by a first and a second laser grooving process according to the example. The silicon debris 750 formed by the laser grooving processes may remain on the upper surface and the side surface of the second interlayer insulating film 40. The silicon debris 750 which has a maximum height T1, is generated on the side surface of the second interlayer insulating film 40 and the side surface of the low dielectric insulating film 20 etched by laser grooving processes, and may be formed to extend to the upper surface of the second interlayer insulating film 40.

After the grooving process, a sawing process may be performed using a plurality of diamond blades 710 and 720.

Figure 8A:
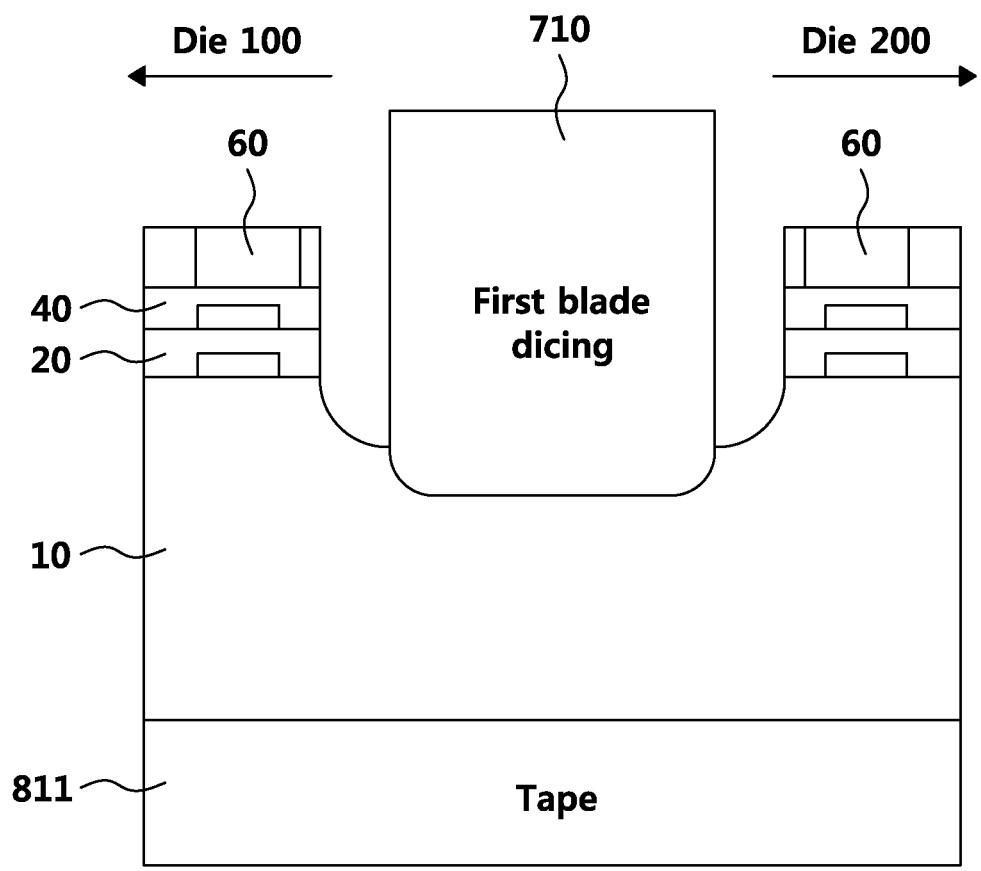
FIG. 8A is a cross-sectional view of an example of a wafer after a first sawing process in accordance with one or more embodiments.

FIG. 8A is a cross-sectional view of an example of a wafer after a first sawing process.

After performing the laser grooving process, the blade dicing process may be conducted. In this example, the cracking of the semiconductor dies 100, 200 caused by the blade dicing process may be prevented.

The semiconductor dies 100, 200 may be formed by removing the silicon substrate 10 by using a diamond blade or similar device. That is, mechanical sawing may be performed on the groove formed by the first and second laser grooving processes to form individual first and second semiconductor dies 100, 200.

The diamond blade dicing process may be performed as a first dicing process and a second dicing process. The sawing process using the blade may be performed at a greater depth than laser grooving. Before the sawing process is implemented, a tape 811 may be attached to a bottom surface of the silicon substrate 10.

The first blade dicing process may be performed using the first diamond blade 710 which has a wide width. Thus, a part of the silicon substrate 10 may be etched by the first blade dicing process.

Figure 8B:
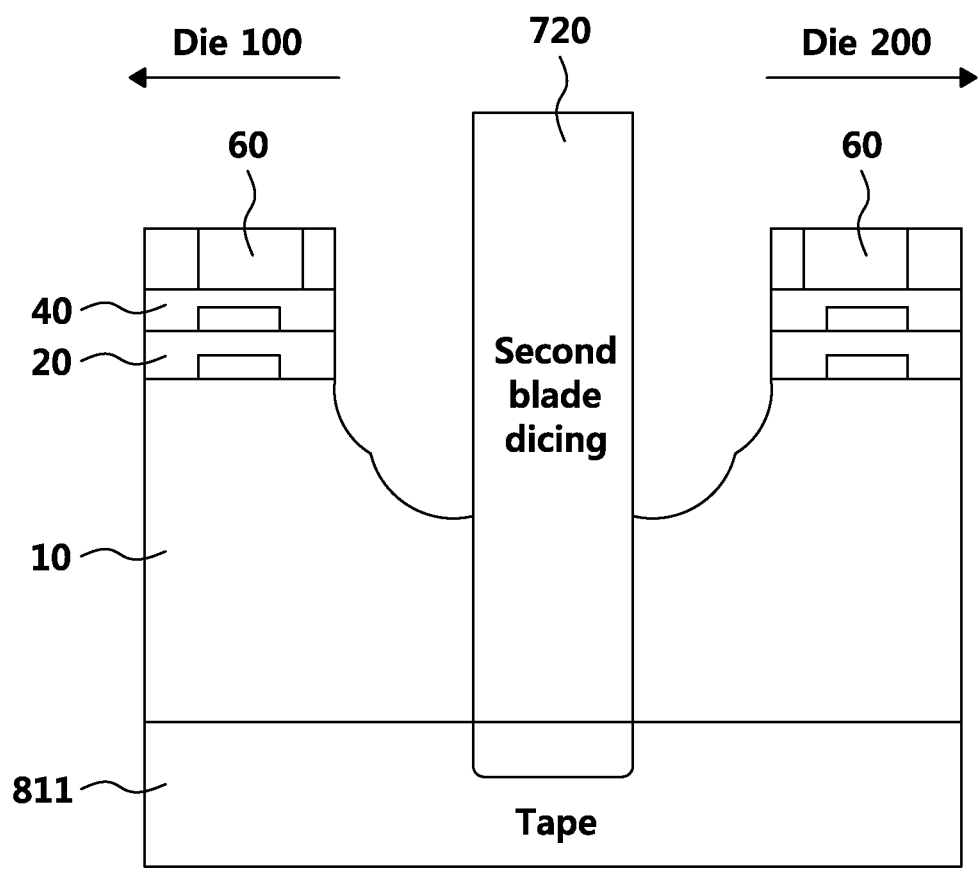
FIG. 8B is a cross-sectional view of an example of a wafer after a second sawing process in accordance with one or more embodiments.

FIG. 8B is a cross-sectional view of an example of a wafer after a second sawing process.

Referring to FIG. 8B, the second blade dicing process may be performed using the second diamond blade 720 which may have a narrower width than the first blade. The remaining silicon substrate 10 may be etched by the second blade dicing process. As a result, the diamond blade may be extended to the tape 811 attached to the bottom surface of the substrate 10.

Figure 9:
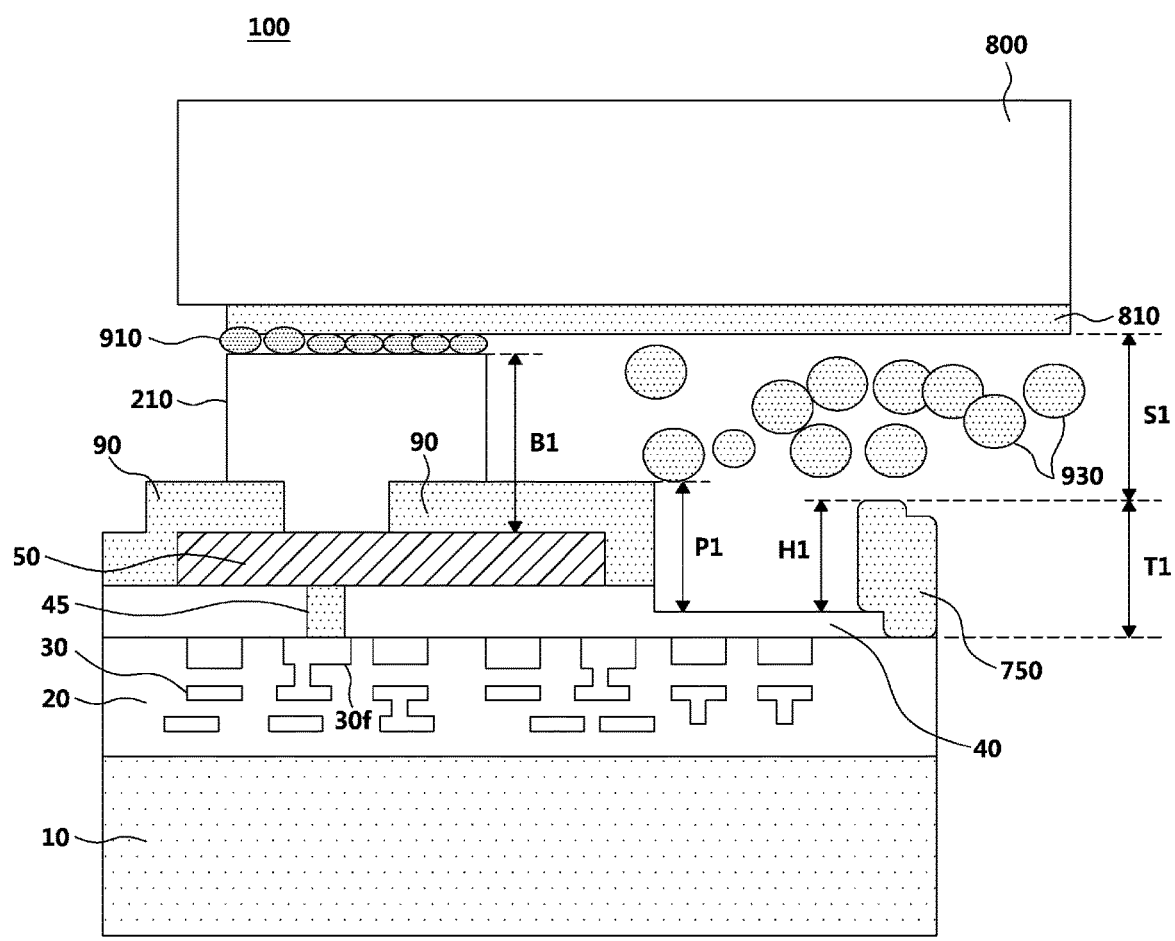
FIG. 9 is a cross-sectional view of an example of a semiconductor die after ACF bonding process in accordance with one or more embodiments.

FIG. 9 is a cross-sectional view of an example of a semiconductor die after an Anisotropic Conductive Adhesive (ACF) bonding process.

ACF bonding process is an interconnection technique that is mostly used for connecting displays to PCB's using anisotropic conductive adhesive and flex foils. ACF-bonding is mostly used to create flexible connections between components such as flexfoil to LCD and flexfoil to PCB. An electro-mechanical connection is created between two components using anisotropic conductive film (ACF). The conductive particles in the film make contact in the Z-direction only when heat and pressure are applied. A minimum contact time is required to ensure the adhesive cures properly.

The ACF bonding process according to the example physically connects bumps of an IC chip to input/output wire patterns 810 formed on a flexible polyimide film (COF film). In order to perform the ACF bonding process according to the example, a flexible film 800 including a plurality of input/output wire patterns 810 is prepared. The bump 210 formed on the individual semiconductor die 100 is attached to the input/output wire patterns 810 by using the anisotropic conductive films including the conductive balls 910 and 930 which have a first size. The size of the conductive balls may become smaller 910 than the original size 930 due to the pressing process.

The input/output wire patterns 810 may be made of a copper component. However, this is only an example, and the input/output wire patterns may be made of components other than copper. The input/output wire patterns 810 are also called as lead wires. The bumps 210 may comprise a plurality of bumps, and may be connected to each other with the input/output wire patterns 810. Nickel plated particles may be formed of the ACF conductive balls 910, and an insulating coating may be formed on the outside of the ACF conductive balls 910. The ACF conductive balls 910 may electrically connect the semiconductor die 100 and the flexible film 800 in cooperation with the bump 210. The ACF conductive balls 910 near the bump 210 may be crushed by pressing the bump 210 toward the COF film 800. Accordingly, the nickel-plated particles may be exposed to electrically connect the semiconductor die 100 and the flexible film 800. The ACF conductive balls 930 in other regions may escape outward during the ACF bonding process.

During the ACF bonding process according to the example, the space S1 between the input/output wire patterns 810 and the silicon debris 750 may secure a very wide space S1 that is greater than the size of the conductive balls 930, so that the conductive balls 930 may escape through the space between the input/output wire patterns 810 and the individual semiconductor die 100.

The maximum height H1 of the silicon debris 750 from the etched top surface of the interlayer insulting films 20, 40 should be as low as possible in order to ensure that the space S1 between the input/output wire patterns 810 and the silicon debris 750 is adequate enough to accommodate conductive balls 930 of various sizes. Accordingly, the space S1 between the silicon debris 750 and the input/output wire patterns 810 should be wide. The space S1 may be secured to pass the ACF conductive balls through the space S1. Therefore, the maximum height of the silicon debris 750 from the etched top surface of the interlayer insulting films 20 or 40 should be decreased to allow for adequate space between the silicon debris 750 and the input/output wire patterns 810 during the ACF bonding process. Accordingly, the ACF conductive balls 930 may easily move externally during ACF bonding process.

The wafer 1000 includes a silicon substrate 10. The first interlayer insulating film 20 may be formed on the silicon substrate 10. The first interlayer insulating film 20 may have a low dielectric constant below 3.0. The second interlayer insulating film 40 may be formed on the first interlayer insulating film 20. A passivation layer 90 may be formed on the upper surface of the second interlayer insulating film 40, and on at least upper and side surfaces of metal pad 50.

Metal pad 50 may be partially enclosed by the passivation layer 90. The passivation layer 90 may be a single silicon nitride film or a stacked silicon nitride/oxide film. As previously illustrated in FIGS. 2A and 2B, the upper parts of the metal pads 50, 60, and 80 may be partially opened, and the metal bump 210 may be electrically connected to the metal pad 50. The semiconductor die 100 may also have a seal-ring region which prevents stress and moisture or similar elements from penetrating into the IC chip in a direction between the die and the scribe line.

The silicon debris 750 generated by the laser grooving process may be formed to a predetermined height from the upper surfaces of the first and second interlayer insulating films 20 and 40. That is, in an example the height of the silicon debris 750 may be lowered by etching the passivation layer 90 and the second interlayer insulating film 40 near the seal-ring region. This secures enough space S1 to easily move out the ACF conductive balls 930.

During the passivation etching process, a portion of the second interlayer insulating film 40 may be over-etched until a predetermined amount of the passivation layer formed on the metal pad is removed. Removal of the passivation layer 90 is also performed in a typical fabrication method using a passivation etch mask. Therefore, the examples may be easily applied by changing the mask pattern in the passivation etch mask.

As described above, when the laser grooving process is conducted into the scribe line 110 after the passivation layer 90 is removed, the silicon debris 750 may be formed from the upper surface of the second interlayer insulating film 40. The maximum height H1 of silicon debris 750 or silicon residue 750 may be lowered because the silicon debris may be formed starting from an over-etched surface of the second interlayer insulating film 40. If the silicon debris is formed starting from the surface of the passivation layer 90, a top surface of the silicon debris 750 or silicon residue 750 may be elevated, which is different from the present example. In other words, the height of the silicon debris 750 may be lowered by at least the thickness of the passivation layer 90 in the present example. Accordingly, the space S1 between the top of the bump 210 and the silicon debris 750 is secured.

After the passivation layer 90 is removed near the seal-ring region 120, the silicon debris 750 may be generated from the upper surface of the interlayer insulating film 40 during the laser grooving process. Therefore, if the thickness of the passivation layer 90 is 3.5 μm, the maximum height of the silicon debris 750 is reduced by 3.5 um.

If the space S1 between the top of the bump 210 and the silicon debris 750 is around 5.5 μm, the ACF conductive balls 930 having diameter about 3 μm in size may move easily, although the silicon debris 750 is formed. Accordingly, short-circuit issues may be prevented.

In an example, in the semiconductor die 100, a top surface of the silicon debris 750 may be lower than a top surface of the bump 210. Since the passivation layer 90 is etched excessively, the second interlayer insulating film 40 may be exposed. The silicon debris 750 according to the example may be at least partially formed on the second interlayer insulating film 40. A bottom surface of the silicon debris 750 may be positioned lower than a bottom surface of the passivation layer 90. A bottom surface of the silicon debris 750 may be located lower than a bottom surface of the bump 210. The maximum height of the silicon debris 750 may be less than half the thickness of the bump 210.

That is, during the laser grooving process, a thermal energy of the laser beam is transferred to the wafer 1000. The metal wirings, the insulating film, and the silicon materials in the chip may be dissolved by the thermal energy of the laser beam, so that the silicon debris or burr is generated by a certain height during the laser grooving. As described above, silicon resides, silicon debris, burrs and the like (hereinafter referred to as "silicon debris") may be formed on the passivation layer 90. If a height or a thickness of the silicon debris 750 is not reduced during the subsequent process, a short-circuit problem may occur.

A laser beam is irradiated to the scribe line 110 from which the passivation layer 90 is removed. On the upper surface of the second interlayer insulating film 40 adjacent to the laser grooving region, silicon debris 750 may be formed at a certain height. At this time, the silicon debris 750 may not be formed starting from the passivation layer 90, but may be formed starting from the upper surface of the second interlayer insulating film 40. As the thickness of the passivation layer 90 is increased, a top surface of the silicon debris 750 may be lowered by the thickness of the passivation layer 90.

Figure 10:
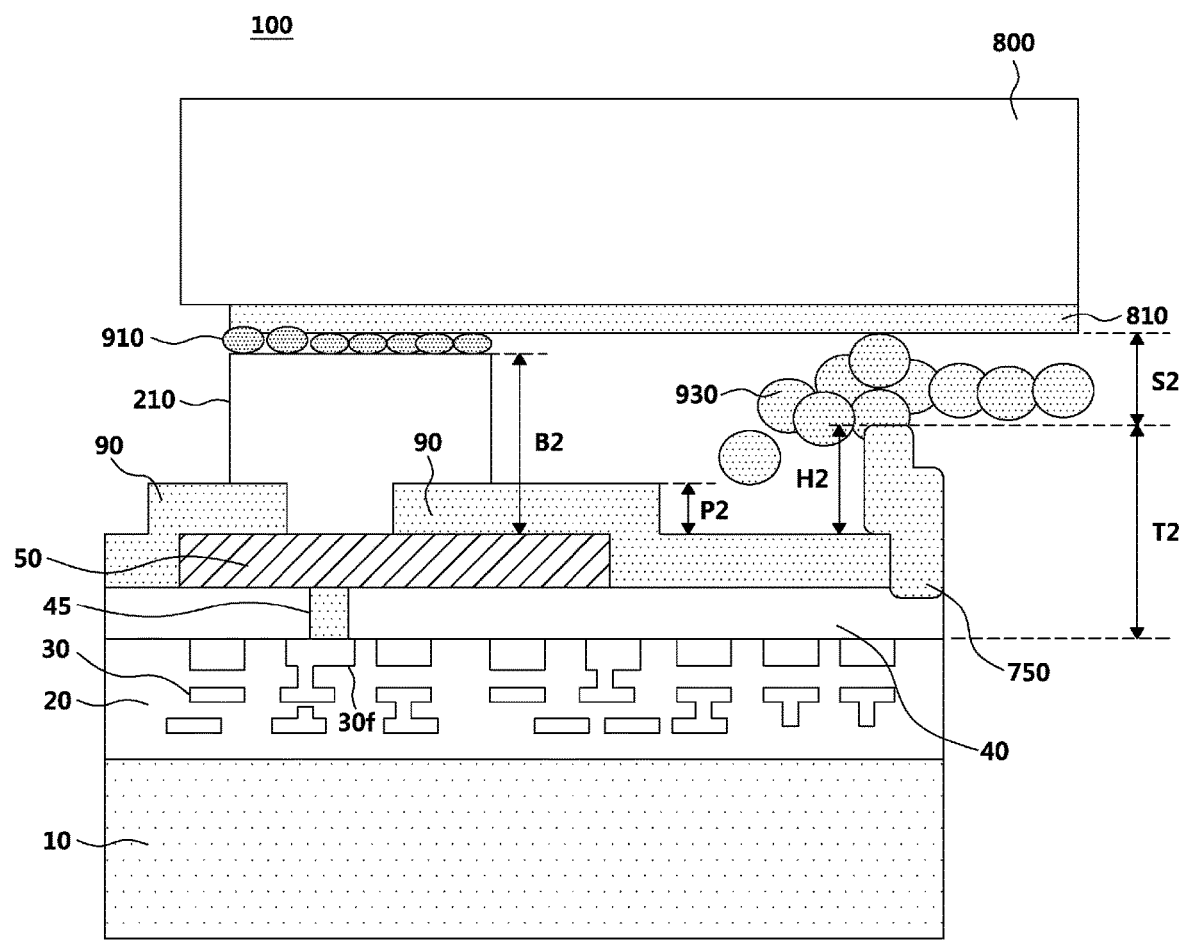
FIG. 10 is another cross-sectional view of an example of a semiconductor die after the semiconductor die is attached to a lead wire in accordance with one or more embodiments.

FIG. 10 is an example of another cross-sectional view of a semiconductor die after the ACF ball bonding process.

As illustrated in FIG. 10, when the silicon debris 750 is generated, the silicon debris 750 may result in a narrow space S2 between the input/output wire patterns 810 and the silicon debris 750. Therefore, the ACF conductive balls 930 may not be able to escape to the outside, and may instead gather in a region near the debris 750, resulting in short-circuit issues.

The above-mentioned problems may occur during the ACF bonding process, which attaches the bumps 210, 220 to the input/output wire patterns 810, when the silicon debris 750 is formed from the upper surface of the passivation layer 90 at the end of the scribe line 110 at a certain height H2.

Some of the ACF conductive balls 930 may be captured in a narrow space S2 between the silicon debris 750 and the input/output wire patterns 810 during the ACF bonding process. Since the ACF conductive balls 930 are conductive, and form a bridge between the silicon debris 750 and the input/output wire patterns 810, a short-circuit failure may result.

This problem occurs when the height H2 of the silicon debris 750 is greater than a desirable threshold. This height H2 may create a narrow space between the silicon debris 750 and the input/output wire patterns 810. The space S2 is to be secured to pass the ACF conductive balls through the space S2. Therefore, the maximum height of the silicon debris 750 should be decreased in order to create enough space between the silicon debris 750 and the input/output wire patterns 810 during the ACF bonding process. This will allow the ACF conductive balls 930 to easily move outside during ACF bonding process.

Typically, the laser beam was irradiated by a laser grooving process while the passivation layer 90 remains as it is in the scribe line. Therefore, the silicon debris 750 is formed from the passivation layer 90.

Figure 11:
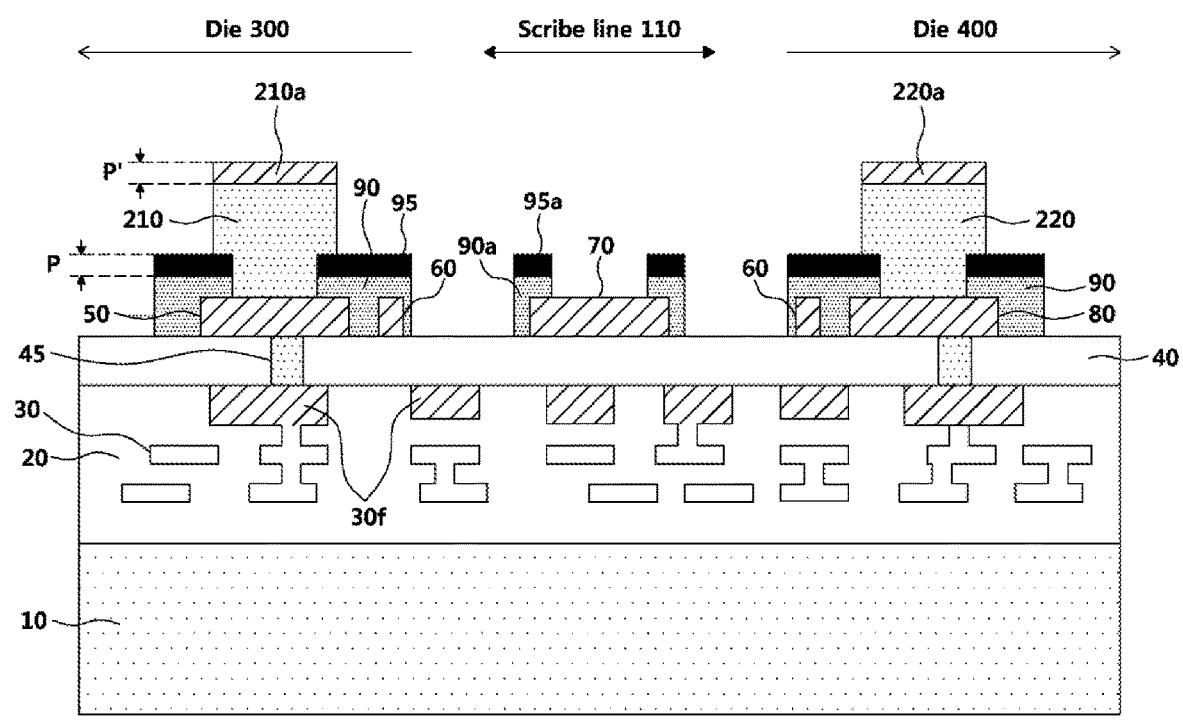
FIG. 11 is a cross-sectional view of an example of a wafer after patterning a passivation layer having increased thickness in accordance with one or more embodiments.

FIG. 11 is a cross-sectional view of an example of a wafer after patterning a passivation layer 90 having increased thickness.

Referring to FIG. 11, an interlayer insulating film 20, 40 of a certain thickness may be formed on the silicon substrate 10. The interlayer insulating film 20, 40 includes a low dielectric insulating film 20 on the active region.

Metal pads 50, 60 and 80 may be formed on the upper portion of the interlayer insulating film 40. A passivation layer 90 may be formed to have a certain thickness to cover the metal pads 50, 60 and 80. The metal pads 50 and 80 may be electrically connected to the bumps 210, 220 through a passivation layer 90 of which the upper portion is partially opened. Although not illustrated in FIG. 11, the metal pad 60 may also be electrically connected to the bumps 210, 220.

The semiconductor dies 300, 400 are IC chips in which electronic circuits are integrated. A scribe line 110 isolates the dies 300, 400. A seal-ring region may be formed between the dies 300, 400 and the scribe line 110.

The passivation layer 90 may be formed to be thicker than typical passivation layers by a thickness of P. When the passivation layer 90 is formed to a predetermined thick, the height of the bump 210 may be formed to be higher based on the thickness of the passivation layer 90. In FIG. 11, P illustrates a state in which the thickness of the passivation layer 90 is formed to be thicker and the heights of the bumps 210 and 220 are greater by a thickness P' 210a and 220a equal to the increased thickness of the passivation layer 90.

Figure 12:
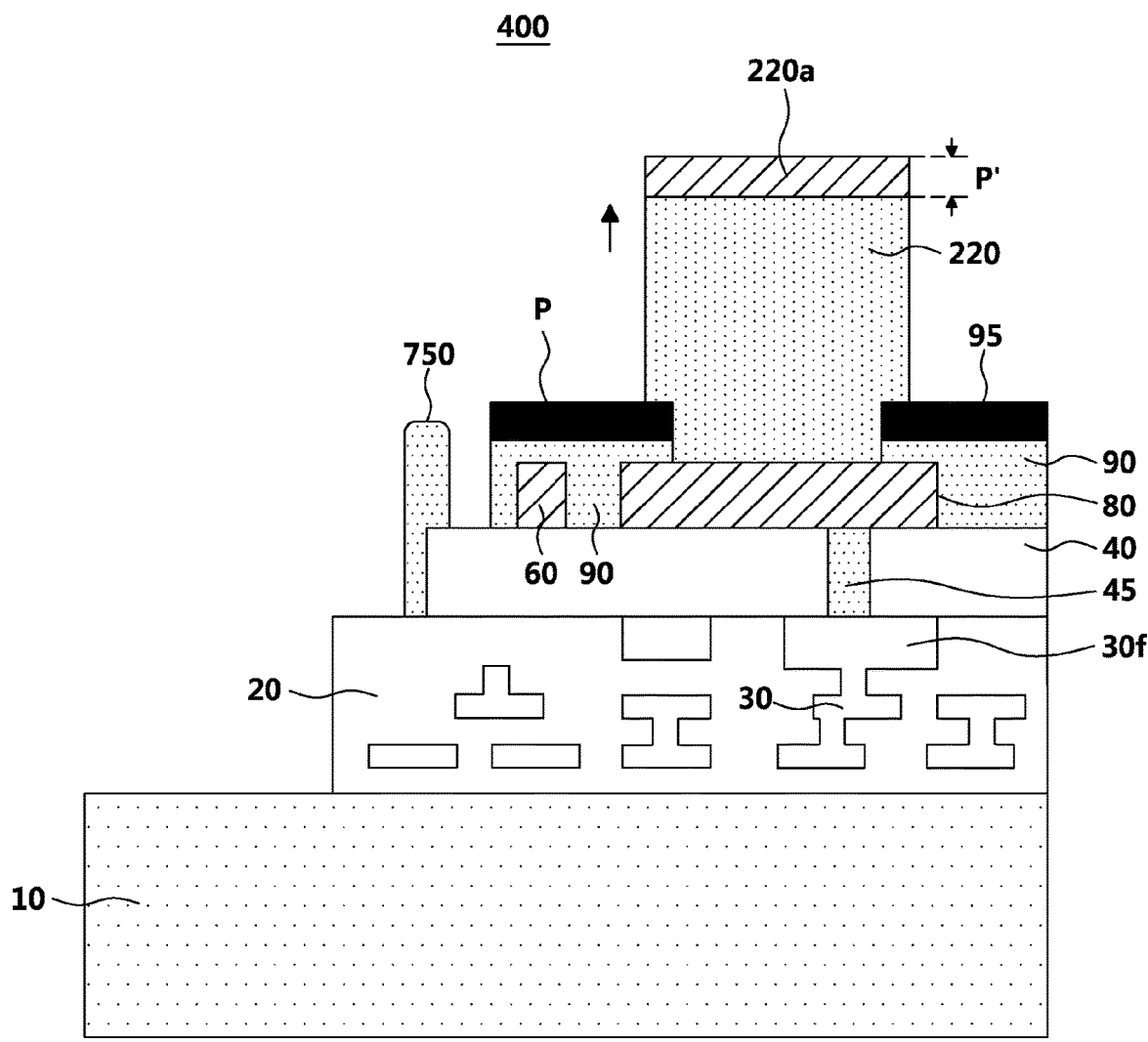
FIG. 12 is a cross-sectional view of an example of a semiconductor die after a laser grooving process in accordance with one or more embodiments.

FIG. 12 is a cross-sectional view of an example of a semiconductor die after a laser grooving process.

In FIG. 12, the silicon debris 750, that is formed on the second interlayer insulating film 40 by the laser grooving process, may be formed at a position lower than the passivation layer 90. Even if the silicon debris 750 is formed to have a height above 5 μm, which is the height generally shown in the laser grooving process, the greater thickness of the passivation layer 90 may easily secure a sufficient space for the ACF conductive balls 930 to move.

The thickness of the passivation layer 90 may be appropriately adjusted based on the height of the silicon debris 750. Additionally, thickening of the passivation layer 90 may be done by utilizing existing semiconductor manufacturing processes without utilizing additional processes.

Instead of making the height of the bump 220 greater, the bump 220 may be formed thicker. However, thickening the bump 220 is inefficient in terms of cost because gold (Au), which is a costly material constituting the bump 220, may be used. Additionally, if the height of the bump 220 is changed, various problems may be caused with bump 220 with regard to subsequent processes.

Therefore, the present example forms the passivation layer 90 thicker than the typical passivation layer 90 in order to provide the effect of increasing the height of the bump 220 instead of thickening the bump 220.

As described above, the examples may completely remove the passivation layer 90 near the seal-ring region 120 or in the scribe line region 110 so that the silicon debris 750 may be formed from the interlayer insulating film 40, and not from the existing passivation layer during the laser grooving process. Therefore, the space between the top of the bump 220 and the silicon debris 750 may be formed to be sufficiently larger than the size of the ACF conductive balls 930, so that the ACF conductive balls 930 may move freely.

According to the manufacturing and packaging method of a semiconductor die of the examples, a passivation layer in the scribe line region 110 provided to distinguish the IC chips in the semiconductor die may be removed.

In addition, in the examples, the thickness of the passivation layer may be formed to be greater than the typical passivation layers in order to provide an effect of increasing the height of the bump.

Therefore, when a laser grooving process for irradiating the scribe line using a laser beam is performed, since the silicon debris is formed from the upper surface of the interlayer insulating film in the scribe line, the space between the bump 210, 220 and the silicon debris 750 may be formed to be greater than the diameter of the ACF conductive balls.

Accordingly, the ACF conductive balls may freely move during the ACF bonding process, and the ACF conductive balls may be prevented from breaking in the areas other than the areas where the bumps are located, so that short-circuit failure may be eliminated and the product performance is improved.

That is, the above examples describe a display IC as an example, but it may also be sufficiently applied to various devices to which a scribe line structure is applied, such as IGBT, MOSFET, TR, and diode wafer.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A manufacturing and packaging method of a semiconductor die comprises:
   preparing a wafer which has a seal-ring region;
   forming a first interlayer insulating film on the wafer;
   forming a metal wiring in the first interlayer insulating film;
   forming a second interlayer insulating film on the first interlayer insulating film;
   forming metal pads on the second interlayer insulating film;
   forming a passivation layer on the metal pads;
   removing a portion of the passivation layer in a region adjacent to the seal-ring region to expose the second interlayer insulating film;
   etching a portion of the second interlayer insulating film in the region adjacent to the seal-ring region;
   forming a bump directly on the metal pads;
   removing the first interlayer insulating film and the second interlayer insulating film in the region adjacent to the seal-ring region by a laser grooving process; and
   dicing the wafer into a first semiconductor die and a second semiconductor die.

2. The method of claim 1 further comprising:
   preparing a flexible film which has input wire patterns and output wire patterns; and
      attaching the bump to at least one of the input wire patterns and the output wire patterns with conductive balls.

3. The method of claim 1, further comprising:
   generating a silicon debris from the laser grooving process,
   wherein the silicon debris is formed starting from a top surface of the second interlayer insulating film.

4. The method of claim 3,
   wherein a height of the silicon debris is lowered by a thickness of the passivation layer.

5. The method of claim 1,
   wherein the laser grooving process comprises a first laser grooving process and a second laser grooving process, and
   wherein a pulse width of the second laser grooving process is greater than a pulse width of the first laser grooving process.

6. The method of claim 1,
   wherein a dielectric constant of the first interlayer insulating film is below 3.0, and the dielectric constant of the first interlayer insulating film is lower than a dielectric constant of the second interlayer insulating film.

7. A manufacturing and packaging method of a semiconductor die comprising:
   preparing a wafer which has a scribe line and a seal-ring-region;
   forming an interlayer insulating film, a metal wiring, and metal pads on the wafer;
   forming a passivation layer on the metal pads and the interlayer insulating film;
   etching the passivation layer;
   exposing a portion of the metal pads;
   etching the interlayer insulating film in a region between the scribe line and the seal-ring region;
   forming a bump on the metal pads after the etching of the interlayer insulating film;
   performing a laser grooving process to generate a silicon debris on the etched interlayer insulating film adjacent to the sealing-region;
   removing the interlayer insulating film in the scribe line by the laser grooving process; and
   dicing the wafer to form the semiconductor die.

8. The method of claim 7,
   wherein the interlayer insulating film comprises a first interlayer insulating film and a second interlayer insulating film,
   wherein a dielectric constant value of the first interlayer insulating film is less than a dielectric constant value of the second interlayer insulating film,
   wherein the metal wiring comprises a copper component,
   wherein the metal pad comprises an aluminum component, and
   wherein the passivation layer comprises a silicon nitride film.

9. The method of claim 7,
   wherein a portion of the passivation layer is removed in a region adjacent to the seal-ring region, and a portion of the passivation layer is maintained in a region adjacent to the bump.

10. The method of claim 7,
    wherein a bottom of the silicon debris is lowered by a thickness of the passivation layer.

11. A manufacturing and packaging method of a semiconductor die comprising:
    forming a first interlayer insulating film on a substrate;
    forming a second interlayer insulating film on the first interlayer insulating film;
    forming metal pads on the second interlayer insulating film;
    forming a passivation layer on the metal pads;
    removing a portion of the passivation layer to expose the second interlayer insulating film;
    forming a bump on the metal pads;
    over-etching a portion of the second interlayer insulating film and a portion of the first interlayer insulating film by a laser grooving process; and generating a silicon debris from the laser grooving process, wherein the silicon debris is formed on an upper surface of the over-etched portion of the second interlayer insulating film, and wherein a bottom surface of the silicon debris is positioned lower than a bottom surface of the passivation layer, and a top surface of the silicon debris is lower than a top surface of the bump.

12. The method of claim 11, wherein a bottom surface of the silicon debris is positioned lower than a bottom surface of the bump.

* * * * *